US006972475B2

(12) United States Patent
Yashita

(10) Patent No.: US 6,972,475 B2
(45) Date of Patent: Dec. 6, 2005

(54) SEMICONDUCTOR DEVICE

(75) Inventor: Takahiro Yashita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 43 days.

(21) Appl. No.: 10/687,912

(22) Filed: Oct. 20, 2003

(65) Prior Publication Data

US 2004/0155257 A1 Aug. 12, 2004

(30) Foreign Application Priority Data

Feb. 12, 2003 (JP) ............................ 2003-033602

(51) Int. Cl.[7] ............................................ H01L 29/78
(52) U.S. Cl. ...................... 257/547; 257/548; 257/341
(58) Field of Search ............................... 257/547, 548, 257/341

(56) References Cited

U.S. PATENT DOCUMENTS 5,475,273 A * 12/1995 Paparo et al. ............... 327/545
5,753,964 A * 5/1998 Yashita et al. .............. 257/547
6,169,309 B1 * 1/2001 Teggatz et al. ............. 257/328
2002/0110989 A1 8/2002 Yamaguchi et al.

FOREIGN PATENT DOCUMENTS

JP HEI 10-107168 4/1998
JP 2000-243973 9/2000

* cited by examiner

*Primary Examiner*—Jerome Jackson
(74) *Attorney, Agent, or Firm*—Leydig, Voit & Mayer, Ltd.

(57) ABSTRACT

A semiconductor device includes an N channel MOS transistor. The N channel MOS transistor includes a first P type buried layer that isolates an N epitaxial region on a P type substrate (P-SUB) from another N epitaxial region, a drain in an N well in the N epitaxial region, a source in a P well surrounding sides of the N well to isolate the N well, and a gate on upper layer portions of the drain and the source. The MOS transistor also includes a second P type buried layer between the N well and the P well and the substrate and contiguous to the P well, and an N buried layer contiguous to the P type buried layer and the P-SUB. The N epitaxial region, the P-SUB, and the first P type buried layer are connected to ground potential.

12 Claims, 4 Drawing Sheets

SEMICONDUCTOR DEVICE

BACKGROUND OF THE INVENTION

1) Field of the Invention

The present invention relates to an output transistor of a motor driver integrated circuit.

2) Description of the Related Art

Recently, the structures of semiconductor devices tend to become more and more complicated so as to realize high integration and high performance. To this end, a semiconductor device having such a complicated structure has various parasitic elements such as parasitic transistors formed therein. The parasitic transistors and the like sometimes adversely influence the operation of the semiconductor device.

For example, if a trigger is input to the circuit of the semiconductor device by external surge or the like, a parasitic thyristor formed in the circuit of the semiconductor device is turned on, sometimes resulting in occurrence of latch-up so that excessive current continuously flows. Specifically, in a lower driving output transistor in a three-phase lower arm used in a driver inverter integrated circuit (IC) or the like for a motor, a back electromotive force is derived from motor driving coils at the time of switching the transistor, and unnecessary negative potential is produced. Thus, the latch-up poses a serious problem.

If attention is paid to structure of a metal oxide semiconductor (MOS) transistor in the semiconductor device, it is found that the following parasitic transistors are formed in the MOS transistor. In an N channel MOS transistor (referred to as "NMOS" hereinafter), a parasitic NPN transistor consists of the following layers and region functioning as emitter, base, and collector, respectively. That is, the parasitic NPN transistor consists of an N well forming a drain region of NMOS, an N type buried layer formed right under the N well and on a P type silicon substrate, the P type silicon substrate, and an island region formed on an N type silicon layer that is formed at an isolated position from this NMOS, functioning as emitter, base, and collector. For example, if negative voltage is applied to the drain that functions as the emitter, the parasitic NPN transistor operates to extract current from other island regions formed on an N type silicon layer. If this extracted current is large, the NPN transistor causes the semiconductor device to malfunction. Further, if the parasitic NPN transistor thus produced and a parasitic PNP transistor produced at the other location form a parasitic thyristor, the thyristor is turned on by external surge or the like to cause latch-up and the elements of the semiconductor device are thermally destroyed at the worst.

Further, as a conventional MOS transistor, a full isolation type MOS transistor is also employed. In an N channel MOS transistor (referred to as "NMOS" hereinafter) of this full isolation type, for example, an N type epitaxial region formed on a P type silicon substrate is isolated by P type isolation regions to form a plurality of island regions and NMOSs are formed in the respective island regions. Each island region consists of the N type epitaxial region. In the N type epitaxial region, a drain region formed in an N well, a source region formed in a P well, and a gate are formed. The surroundings (side faces) of the N well are surrounded by the P well. Right under the N well and the P well, a P type buried layer is formed so as to be joined to the N well and the P well, and the N well is surrounded by the P well and the P type buried layer. Further, an N type buried layer is formed right under the P type buried layer and on the P type silicon substrate, and joined to the N type epitaxial regions located on the side faces of the outermost periphery of the island region. The P well and the P type buried layer are surrounded by the N type epitaxial regions and the N type buried layer. Thus, the NMOS has a structure in which the P+ buried region shuts off the N well from the N+ buried region. This structure can prevent the production of a parasitic NPN transistor in which the N well and the N+ buried region function as an emitter, the P type silicon substrate functions as a base, and the portion of the other island region that consists of the N type silicon layer functions as a collector. It thereby prevents current from being extracted from the other island regions.

Moreover, a bipolar complementary metal oxide semiconductor (BiCMOS) transistor disclosed in Japanese Patent Application Laid-Open No. 10-107168 (pages 3 and 4), has the following structure. That is, an N type epitaxial region formed on a P type silicon substrate is isolated by P+ type isolation regions to form a plurality of island regions. In each island region, a P channel metal-oxide semiconductor field-effect transistor (MOSFET) (referred to as "PMOS" hereinafter) and an NPN bipolar transistor are formed. In addition, the surroundings (side faces) of the N type epitaxial region in which the source and the drain of each PMOS transistor are formed are surrounded by a P+ deriving region. Below the PMOS transistor, a P+ buried region is formed to be joined to the P+ deriving region. The PMOS is surrounded by the P+ deriving region and the P+ buried region. Further, the surroundings (side faces) of the N type epitaxial region in which the P+ deriving region and the P+ buried region are formed, are surrounded by an N+ deriving region. Below the P+ buried region, an N+ buried region is formed to be joined to the N+ deriving region and the P+ buried region. Thus, the region in which the P+ deriving region and the P+ buried region are surrounded by the N+ deriving region and the N+ buried region is formed. In relation to this PMOS, an NPN bipolar transistor is formed in one of the other island regions, whereby the PMOS and the NPN bipolar transistor constitute the BiCMOS. The P+ deriving region is connected to a ground potential (GND), and the N+ deriving region is connected to a power supply potential. The BiCMOS having such a structure can prevent production of a parasitic NPN transistor.

However, according to the conventional full isolation type MOS transistor, if the potential of the drain region right under the N well becomes negative, the parasitic PNP thyristor that consists of the P type silicon substrate, the N+ buried layer, the P type buried layer, and the N well is turned on. As a result, latch-up may disadvantageously, unavoidably occur.

In addition, according to the conventional technology disclosed in the patent document, the BiCMOS that consists of the PMOS and the NPN transistor can prevent the production of the parasitic NPN transistor, but cannot prevent the occurrence of a parasitic thyristor.

SUMMARY OF THE INVENTION

It is an object of this invention to solve at least the problems in the conventional technology.

The semiconductor device according to the present invention includes an N channel metal oxide semiconductor (MOS) transistor. The N channel MOS transistor includes a P type semiconductor substrate, an N type epitaxial region formed on the P type semiconductor substrate, a first P type buried layer isolating the N type epitaxial region from another N type epitaxial region, and an. N well formed in the N type epitaxial region. The N channel MOS transistor also includes a drain region formed in the N well, a P well surrounding side faces of the N well so as to be separated from the N well, a source region formed in the P well, and a gate formed on each upper layer portion of the drain region and the source region. The N channel MOS transistor further includes a second P type buried layer formed below the N well and the P well so as to be joined to the P well and to be separated from the P type semiconductor substrate and the first P type buried layer, and an N type buried layer formed so as to be joined to the second P type buried layer and the P type semiconductor substrate and to be separated from the P well, the N well, and the first P type buried layer. A first electrode electrically connected to the N type epitaxial region, a second electrode electrically connected to the P type semiconductor substrate, and a third electrode electrically connected to the first P type buried layer are connected to ground potential.

These and other objects, features and advantages of the present invention are specifically set forth in or will become apparent from the following detailed descriptions of the invention when read in conjunction with the accompanying drawings.

DETAILED DESCRIPTION

Embodiments of the semiconductor device according to the present invention will be explained in detail below with reference to the accompanying drawings. It is noted that the present invention is not limited by the embodiments.

Figure 1:
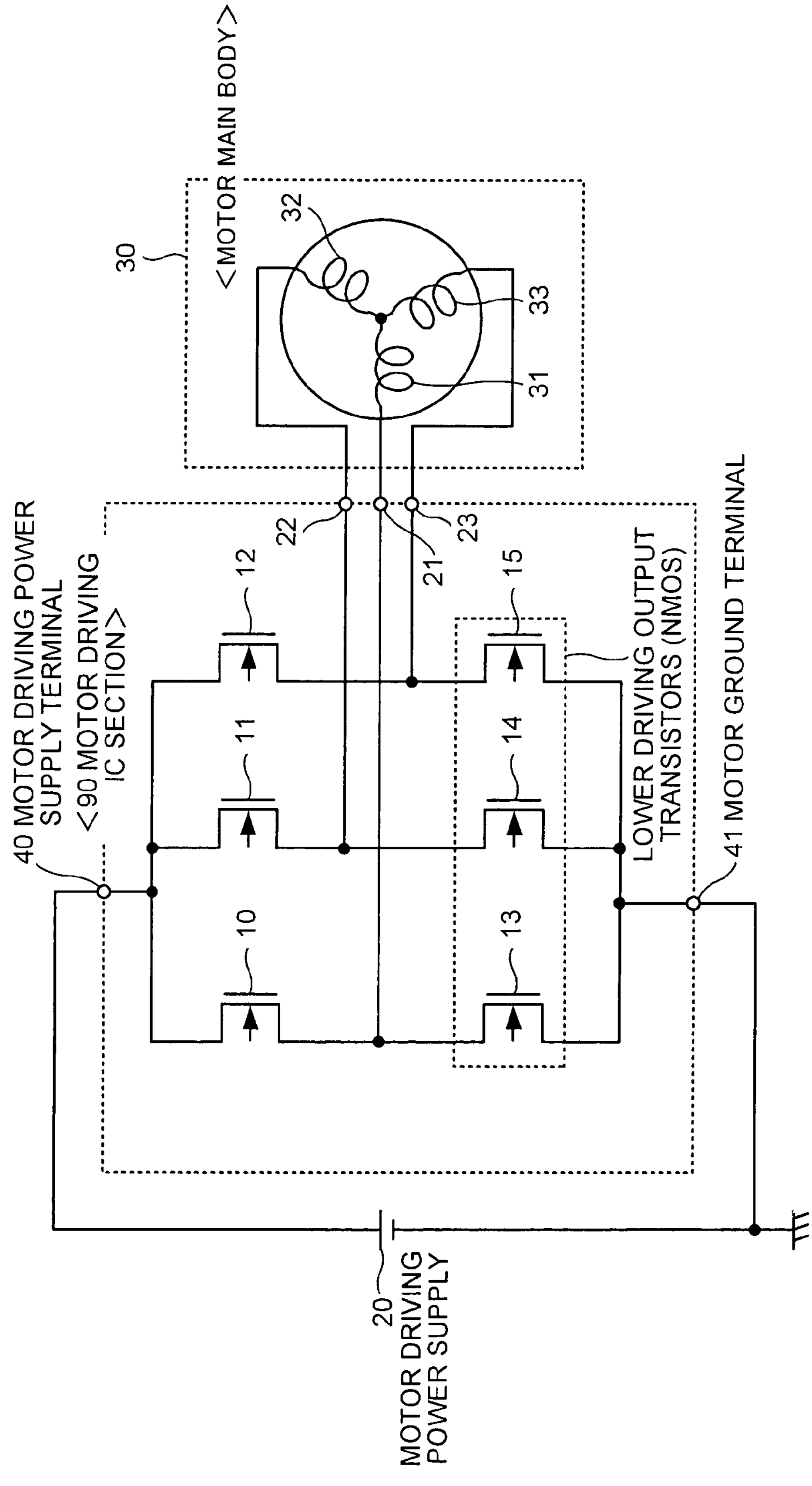
FIG. 1 shows a schematic diagram of a circuit configuration in which output transistors according to the present invention are used.

A first embodiment of the present invention will be explained with reference to FIGS. 1 to 3. FIG. 1 shows one example of an IC circuit that employs output transistors serving as switching elements of an inverter. This IC circuit is the circuit of a driver that drives a solenoid load in a motor or the like. The driver circuit includes a main body of the motor 30, a motor driving IC section 90 that controls the motor main body 30 to be driven, and a motor driving power supply 20.

The motor driving IC section 90 is formed by a three-phase voltage type inverter circuit. Each transistor is formed by six switching transistors each consisting of three-phase upper and lower arms. A motor driving power supply terminal 40 is electrically connected to the drain-side electrodes of the three N channel metal oxide semiconductor transistors (referred to as "NMOS" hereinafter) that are upper driving transistors. A voltage supplied from the motor power supply 20 is supplied to the drains of the upper driving NMOSs 10 to 12, respectively, through the motor driving power supply terminal 40. The source-side electrodes of the NMOSs 10 to 12 are connected to motor output terminals 21 to 23, respectively. The motor output terminals 21 to 23 are connected to motor driving coils 31 to 33 provided in the motor main body 30, respectively. Further, the motor output terminals 21 to 23 are electrically connected to the drain-side electrodes of three NMOSs 13 to 15 that are lower driving output transistors, respectively. Voltages from the motor driving coils 31 to 33 are supplied to the drains of the lower driving NMOSs 13 to 15 through the motor output terminals 21 to 23, respectively. The source-side electrodes of the lower driving NMOSs 13 to 15 are connected to the ground through a motor ground terminal 41.

The operation of this circuit shown in FIG. 1 will next be explained. A case when the NMOSs 10, 12, and 14 are turned on and the NMOSs 11, 13, and 15 are turned off at a certain timing, will be considered. At this timing, current flows through the NMOS 10, the motor output terminal 21, the motor 30, the motor output terminal 22, and the NMOS 14 in this order. Therefore, with respect to the voltage between the motor output terminals 21 and 22, the voltage from the motor driving power supply changes the pole of the motor output terminal 21 to a positive pole. In addition, current flows through the NMOS 12, the motor output terminal 23, the motor 30, the motor output terminal 22, and the NMOS 14 in this order. Therefore, with respect to the voltage between the motor output terminals 22 and 23, the voltage from the motor driving power supply changes the pole of the motor output terminal 22 to a negative pole. Further, since both the motor output terminals 21 and 23 are connected to the positive side of the motor driving power supply, they are short-circuited and no voltage appears between the motor output terminals 22 and 23. In this way, the six NMOSs 10 to 15 are turned on or off at predetermined timings, whereby the line voltages of the motor output terminals 21 to 23 have negative or positive polarity, and a wave in one cycle consisting of six modes is generated. Further, the line voltages of the motor output terminals 21 to 23 are turned into three-phase alternate currents different by 120° in phase. Furthermore, using pulse width modulation (PWM) control, the number of pulses, pulse interval, pulse width and the like of output voltages are controlled, thereby equivalently creating a sine wave.

The motor is driven using this sine wave. However, when switching the respective NMOSs 10 to 15, a back electromotive force is generated by motor driving coils 31 to 33.

As explained in, for example, "Description of the Related Art", the negative voltage is applied to the drain regions of the lower driving output transistors.

Figure 2:
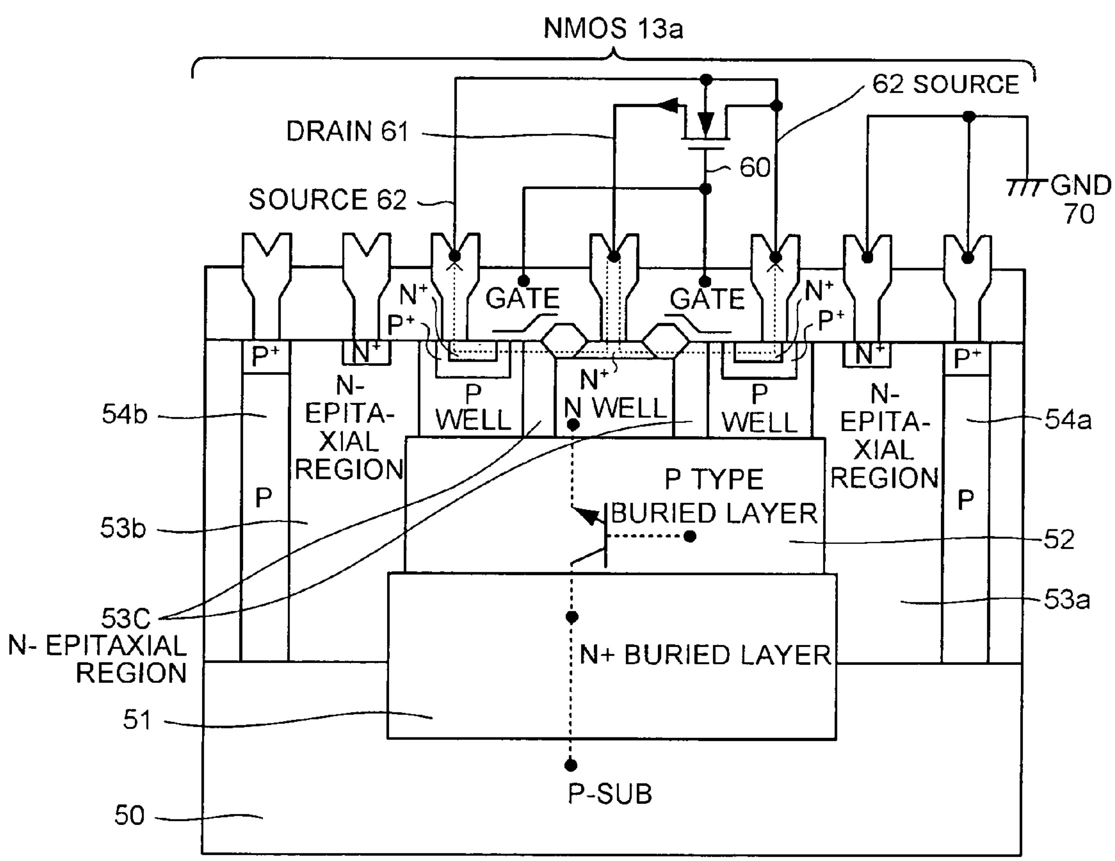
FIG. 2 schematically shows the sectional structure and circuit diagram of an NMOS transistor according to a first embodiment of the present invention.
Figure 3:
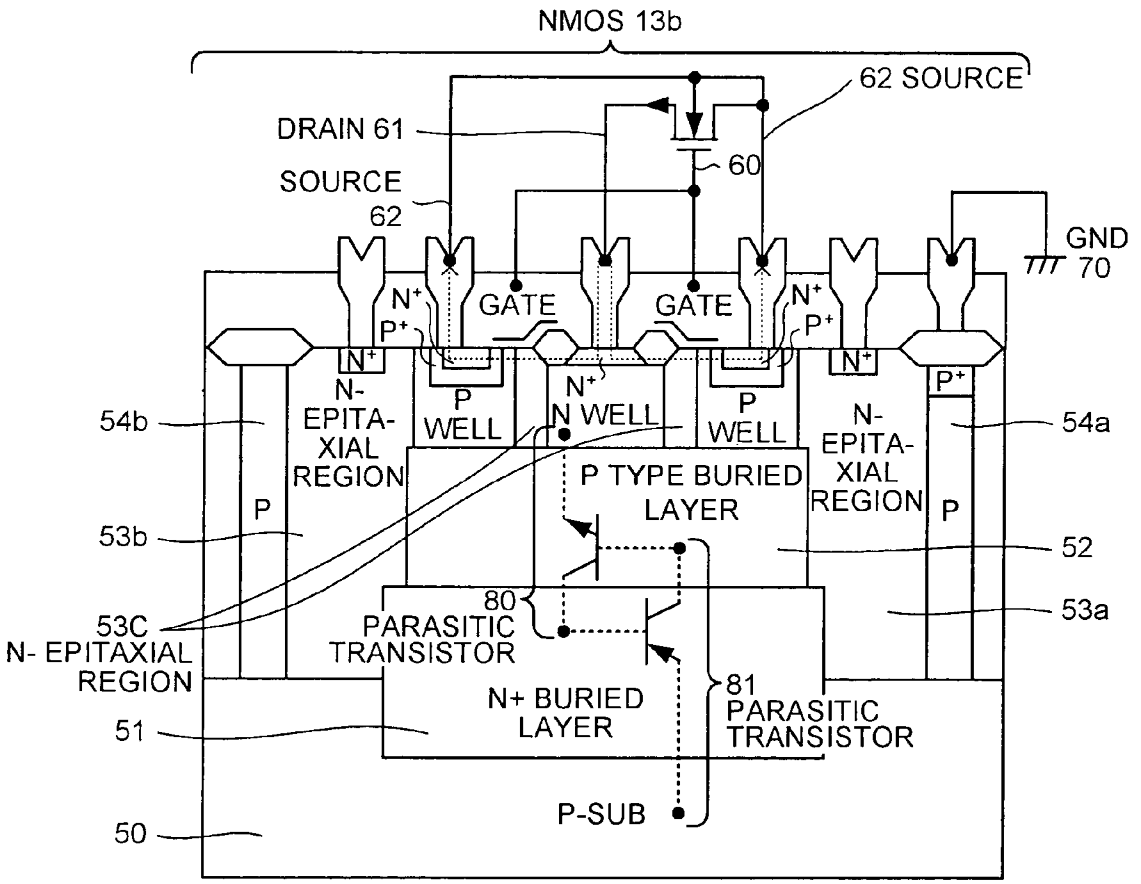
FIG. 3 schematically shows the sectional structure and circuit diagram of the NMOS transistor if an N- epitaxial region is not grounded to a ground potential.

FIG. 2 shows an example of the circuit that prevents the adverse influence of a parasitic transistor followed by, for example, the generation of the negative voltage. FIG. 2 schematically shows the sectional structure of an NMOS 13*a* and a circuit diagram thereof according to the first embodiment. In FIG. 2, one of the lower driving NMOSs 13 to 15 shown in FIG. 1, e.g., the NMOS 13*a* is shown. The NMOS 13*a* in the first embodiment has N− epitaxial regions 53*a*, 53*b*, and 53*c* formed on a P type silicon substrate (referred to as "P-SUB" hereinafter) 50. A drain 61 of the NMOS 13*a* is connected to an electrode on an N+ diffused layer formed in an N well. A source 62 of the NMOS 13*a* is connected to an electrode on an N+ diffused layer and a P+ diffused layer formed in a P well. The drain 61 and the source 62 as well as a gate 60 constitute the NMOS 13*a*. The P+ diffused layer and a P well right under the gate 60 serve as the channel region (back gate portion) of the NMOS.

The side faces of the N well are surrounded by the N− epitaxial regions 53*c*, and by the P well through the N− epitaxial regions 53*c*.

A P type buried layer 52 is formed under the N well in which the drain 61 is formed, and under the P wells in which the source 62 is formed so as to be connected to the N and P wells. Therefore, the N well of the NMOS 13*a* is surrounded by the P well and the P type buried layer 52 consisting of a silicon layer opposite in conductive type to the N well. The full isolation refers to isolation generated by thus surrounding the N well.

An N+ buried layer 51 which is an N type buried layer is formed below the P type buried layer 52 so as to be joined to the P type buried layer 52. The N− epitaxial regions 53*a* and 53*b*, which are N type silicon layers, are formed outside of the P wells and on the sides on which the drain 61 is not formed so as to be joined to the P wells, the P type buried layer 52, and the N+ buried layer 51.

As a result, the P well and the P type buried layer 52 are surrounded by the N+ buried layer 51 and the N− epitaxial regions 53*a* and 53*b*.

P type buried layers 54*a* and 54*b* are arranged outside of the N− epitaxial regions 53*a* and 53*b*, respectively, and the sides on which the source 62, drain 61, and gate 60 of the NMOS 13*a* are not formed. The layers 54*a* and 54*b* are element isolation layers, by which one island region is formed. The P type buried layers 54*a* and 54*b* are connected to a GND 70 which is at a ground potential.

In the first embodiment, the N− epitaxial region 53*a* is connected to the GND 70 by a metal wiring or the like. As a result, the potential of the N− epitaxial region 53*a* is almost equal to that of the GND 70.

In order to clarify the difference in configuration between the NMOS in the first embodiment and the conventional NMOS, the disadvantages of the configuration of the conventional NMOS will be explained below. FIG. 3 shows the structure of an NMOS 13*b* when the N− epitaxial region 53*a* is not connected to the GND 70. In switching the NMOSs 10 to 15 shown in FIG. 1, there is a timing at which a back electromotive force is generated by the motor driving coils 31 to 33, and a negative electromotive force is generated to the drain electrodes of the lower driving output transistors NMOSs 13 to 15 through the motor output terminal 22.

If high negative voltage is applied to the drain 61 of, for example, the NMOS 13*b*, a parasitic NPN transistor 80 and a parasitic PNP transistor 81 are formed. The parasitic NPN transistor 80 is formed by the N well located below the drain 61 functioning as an emitter, the P type buried layer 52 as a base, and the N+ buried layer 51 as a collector. The parasitic PNP transistor 81 is formed by the P type buried layer 52 functioning as a collector, the N+ buried layer 51 as a base, and the P-SUB 50 as an emitter. The parasitic NPN transistor 80 and the parasitic PNP transistor 81 form a parasitic thyristor. As already explained, if negative voltage is applied to the drain 61 of the NMOS 13*b*, the potential of the N well becomes lower than that of the P type buried layer 52. In addition, in the parasitic NPN transistor 80, the potential of the emitter is lower than that of the base. As a result, the parasitic NPN transistor 80 is turned on. Further, as the transistor 80 is turned on, the potential of the N+ buried layer 51 becomes lower than that of the P-SUB 50 and the potential of the base of the parasitic. PNP transistor 81 become lower than that of the emitter thereof. As a result, the parasitic PNP transistor 81 is turned on. Electrons are amplified by the parasitic NPN transistor 80 to be output to the collector (N+ buried layer 51), and the output electrons are injected to the base (N+ buried layer 51) of the parasitic PNP transistor 81. Likewise, holes are amplified by the parasitic PNP transistor 81 to be output to the collector (P type buried layer 52), and the output holes are injected to the base (P type buried layer 52) of the parasitic NPN transistor 80. Thus, the parasitic PNP transistor 81 extracts large current from the P-SUB 50. The current continuously flows through the parasitic NPN transistor 80 and the parasitic PNP transistor 81, thereby causing latch-up and thermally fracturing the junctions of the elements.

Referring back to FIG. 2, according to the NMOS 13*a* in the first embodiment, the N− epitaxial region 53*a* is connected to the GND 70, and therefore even if heavy negative load is applied to the drain 61 of the NMOS 13*a*, the N− epitaxial region 53*a* connected to the GND 70 and the N+ buried layer 51 are almost equal in potential to the GND 70. Further, the P-SUB 50 is almost equal in potential to the GND 70, and therefore, it is possible to consider that there is no potential difference between the N+ buried layer 51 and the P-SUB 50. Accordingly, a parasitic PNP transistor in which the P type buried layer 52 functions as a collector, the N+ buried layer 51 functions as a base, and the P-SUB 50 functions as an emitter, does not operate due to lack of the potential difference between the emitter and the base. As a result, differently from the NMOS 13*b* shown in FIG. 3, the parasitic thyristor is not formed and latch-up does not occur to the NMOS 13*a* shown in FIG. 2, making it possible to prevent the thermal destruction and the like of the constituent elements of the NMOS 13*a*.

With the structure of the NMOS 13*a* shown in FIG. 2, the parasitic NPN transistor is formed by the N well, the P type buried layer 52, and the N+ buried layer 51. However, since this parasitic NPN transistor extracts current from the P-SUB 50 equal in potential to the N+ buried layer 51, the negative voltage from the drain 61 does not cause the thermal destruction of the constituent elements of the NMOS 13*a*.

As explained so far, according to the first embodiment, the N− epitaxial region 53*a* is connected to the GND 70. Therefore, there is no potential difference between the N+ buried layer 51 and the P-SUB 50. Accordingly, the parasitic PNP transistor in which the P type buried layer 52 functions as a collector, the N+ buried layer 51 functions as a base, and the P-SUB 50 functions as an emitter does not operate, and therefore the parasitic thyristor is not formed, and latch-up does not occur. Thus, it is possible to prevent the thermal destruction of the constituent elements of the NMOS 13*a*.

Figure 4:
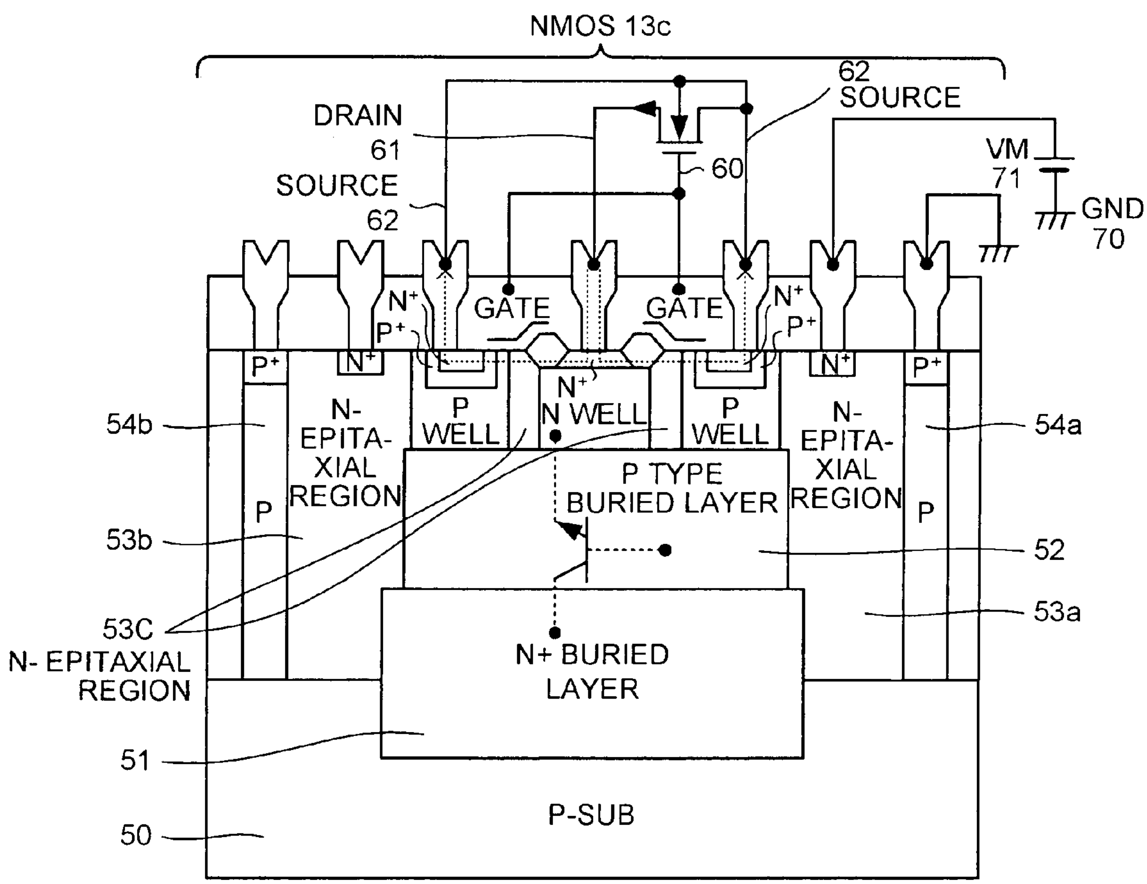
FIG. 4 schematically shows the sectional structure and circuit diagram of an NMOS transistor according to a second embodiment of the present invention.

A second embodiment of the present invention will be explained with reference to FIG. 4. FIG. 4 schematically shows the sectional structure and circuit diagram of an NMOS 13*c* according to the second embodiment. Among the respective constituent elements of the NMOS 13*c* shown in FIG. 4, the elements having the same functions as those of the NMOS 13*a* and NMOS 13*b* of the first embodiment shown in FIG. 1 to FIG. 3 are denoted by the same reference symbols, respectively, and will not be explained herein repeatedly. In the NMOS 13*c* of the second embodiment, the N− epitaxial region 53*a* is connected to an arbitrary power supply potential (referred to as "VM 71" hereinafter) by a metal wiring or the like so that an element such as a current detection resistor can be inserted between the source 62 and the GND 70.

In the NMOS 13*c* shown in FIG. 4, if heavy load is applied to the drain 61 of the NMOS 13*c*, the N+ buried layer 51 becomes higher in potential than the P-SUB 50 connected to the ground potential because the N+ buried layer 51 is electrically connected to the VM 71 through the N− epitaxial region 53*a*, and a parasitic diode formed by the N+ buried layer 51 and the P-SUB 50 is biased in a backward direction. Therefore, no current flows from the N+ buried layer 51 to the P-SUB 50. The current supplied from the VM 71 flows through the N− epitaxial region 53*a*, the N+ buried layer 51, the P type buried layer 52, and the N well in this order, and flows into the drain 61. Consequently, the parasitic thyristor formed in the NMOS structure show in FIG. 3 is not generated, and the latch-up does not occur, and it is thereby possible to prevent the thermal destruction of the constituent elements of the NMOS 13*c*.

If an element such as a current detection resistor is inserted between the sources of the lower driving output transistors (NMOSs 13 to 15) and the motor ground terminal 41, which is at the ground potential, shown in FIG. 1, the potential of the back gate consisting of the P+ diffused layer and the P well becomes higher than the potential (ground potential) of the motor ground terminal 41. In this case, if the N− epitaxial region 53*a* is at the ground potential, a parasitic diode consisting of the P well constituting the back gate and the N− epitaxial region 53*a* is biased in a forward direction. As a result, current flows from the P well and the P+ diffused layer to the N− epitaxial region 53*a*. This current causes the semiconductor device to malfunction. By contrast, according to the NMOS 13*c* in the second embodiment, the N− epitaxial region 53*a* is connected to the power supply potential. Therefore, the parasitic diode consisting of the P well that constitutes the back gate and the N− epitaxial region 53*a* is biased in a backward direction. As a result, no current flows from the N− epitaxial region 53*a* to the P well and the P+ diffused layer. Consequently, even if an element such as a current detection resistor is inserted between the source 62 and the motor ground terminal 41, the NMOS 13*c* does not malfunction. It is noted that if the decrease of the potential of the VM 71 caused by the diffused resistance of the N− epitaxial region 53*a* is ignored, it suffices that the potential of the VM 71 is equal to or higher than that of the back gate.

As explained so far, according to the second embodiment, the N− epitaxial region 53*a* is connected to the VM 71. Therefore, the potential of the N+ buried layer 51 is higher than that of the P-SUB 50 connected to the ground potential, and no current flows from the N+ buried layer 51 to the P-SUB 50. Consequently, the parasitic PNP transistor in which the P type buried layer 52 functions as a collector, the N+ buried layer 51 functions as a base, and the P-SUB 50 functions as an emitter does not operate, and therefore the parasitic thyristor is not formed and latch-up does not occur. Thus, it is possible to prevent the thermal destruction of the constituent elements of the NMOS 13*c*. Further, since the N− epitaxial region 53*a* is connected to the power supply potential, the parasitic diode comprised of the P well that constitutes the back gate and the N− epitaxial region 53*a* is biased in a backward direction, and no current flows through the N− epitaxial region 53*a*, the P well, and the P+ diffused layer. Accordingly, even if the element such as the current detection resistor is inserted between the source 62 and the motor ground terminal 41, it is advantageously possible to prevent the NMOS 13*c* from malfunctioning.

As explained so far, according to the present invention, the semiconductor device that can be used for the lower driving output transistors of a totem pole output type includes a full isolation type NMOS structure, and the N type epitaxial region of the NMOS is connected to the ground potential. It is, therefore, possible to prevent the occurrence of the parasitic thyristor. It is thereby possible to prevent the occurrence of the latch-up that large current is extracted from the P type silicon substrate, and to prevent the thermal destruction of the semiconductor device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising an N channel metal oxide semiconductor (MOS) transistor, the N channel MOS transistor including:

a P type semiconductor substrate;

an N type epitaxial region on the P type semiconductor substrate;

a first P type buried layer isolating the N type epitaxial region from another element;

an N well in the N type epitaxial region;

a drain region in the N well;

a P well surrounding the N well and not in physical contact with the N well;

a source region in the P well;

a gate on the drain region and the source region;

a second P type buried layer between the N well and the P well and the P type semiconductor substrate, contiguous to the P well and not in physical contact with the P type semiconductor substrate and the first P type buried layer;

an N type buried layer contiguous to the second P type buried layer and the P type semiconductor substrate and not in physical contact with the P well, the N well, and the first P type buried layer; and a first electrode electrically connected to the N type epitaxial region and a second electrode electrically connected to the P type semiconductor substrate through the first P type buried layer, the first and second electrodes being connected to ground potential.

2. A semiconductor device comprising an N channel metal oxide semiconductor (MOS) transistor, the N channel MOS transistor including:

a P type semiconductor substrate;

an N type epitaxial region on the P type semiconductor substrate;

a first P type buried layer isolating the N type epitaxial region from another element;

an N well in the N type epitaxial region;

a drain region in the N well;

a P well surrounding the N well and not in physical contact with the N well;

a source region in the P well;

a gate on the drain region and the source region;

a second P type buried layer between the N well and the P well and the P type semiconductor substrate, contiguous to the P well and not in physical contact with the P type semiconductor substrate and the first P type buried layer;

an N type buried layer contiguous to the second P type buried layer and the P type semiconductor substrate and not in physical contact with the P well, the N well, and the first P type buried layer;

a first electrode electrically connected to the N type epitaxial region and a second electrode electrically connected to the P type semiconductor substrate through the first P type buried layer, the second electrode being connected to ground potential; and a connection between the first electrode and the ground potential so that a power supply potential can be supplied to the N type epitaxial region.

3. The semiconductor device according to claim 1, wherein the source region is an N type semiconductor region, the semiconductor device further including a third electrode electrically connected to the source region and contacting both of the N type semiconductor region and a P type semiconductor region, the P type semiconductor region surrounding the N type semiconductor region, the third electrode not being in physical contact with the P well.

4. The semiconductor device according to claim 1, wherein the drain region is an N type semiconductor region.

5. The semiconductor device according to claim 1, wherein the first electrode is connected to an N type semiconductor region in the N type epitaxial region and is not in physical contact with the N type epitaxial region.

6. The semiconductor device according to claim 1, wherein the second electrode is connected to a P type semiconductor region in the first P type buried layer and is not in physical contact with the first P type buried layer.

7. The semiconductor device according to claim 1, wherein the semiconductor device is a switching element of an inverter of a motor driver.

8. The semiconductor device according to claim 2, wherein the source region is an N type semiconductor region, the semiconductor device further including a third electrode electrically connected to the source region and contacting both of the N type semiconductor region and a P type semiconductor region, the P type semiconductor region surrounding the N type semiconductor region, the third electrode not being in physical contact with the P well.

9. The semiconductor device according to claim 2, wherein the drain region is an N type semiconductor region.

10. The semiconductor device according to claim 2, wherein the first electrode is connected to an N type semiconductor region in the N type epitaxial region and is not in physical contact with the N type epitaxial region.

11. The semiconductor device according to claim 2, wherein the second electrode is connected to a P type semiconductor region in the first P type buried layer and is not in physical contact with the first P type buried layer.

12. The semiconductor device according to claim 2, wherein the semiconductor device is a switching element of an inverter of a motor driver.

* * * * *